United States Patent [19]

Min

[11] Patent Number: 4,638,293

[45] Date of Patent: Jan. 20, 1987

[54] BURGLAR ALARM BUILT IN CAR STEREO

[76] Inventor: Byung-Woo Min, 970 S. Kingsley Dr. #310, Los Angeles, Calif. 90006

[21] Appl. No.: 642,431

[22] Filed: Aug. 20, 1984

[51] Int. Cl.$^4$ ............................................. B60R 25/00
[52] U.S. Cl. ..................................... 340/63; 340/693; 340/64; 307/10 AT; 180/287
[58] Field of Search ................... 340/63, 64, 65, 691, 340/693; 307/10 AT; 180/287

[56] References Cited

U.S. PATENT DOCUMENTS

| | | | |
|---|---|---|---|
| 4,162,479 | 7/1979 | Nickell et al. | 340/63 |
| 4,187,496 | 2/1980 | Kovens et al. | 340/63 |
| 4,205,300 | 5/1980 | Ho et al. | 340/64 X |
| 4,220,947 | 9/1980 | Yamamoto | 340/63 |
| 4,262,279 | 4/1981 | Dubilirer | 340/63 |
| 4,302,747 | 11/1981 | Belmuth | 340/63 X |

Primary Examiner—James L. Rowland
Assistant Examiner—Jeffery A. Hofsass
Attorney, Agent, or Firm—Birch, Stewart, Kolasch & Birch

[57] ABSTRACT

An alarm system for an automobile comprising an alarm circuit chip built into the car stereo housing and interfaced with the stereo circuitry. The alarm system is controlled and programmed by the same selector buttons and controls which operate the car stereo when in an alarm mode. Some of the sensors for the alarm system are disposed in conventional circuit portions of the car, such as the door, hood and trunk light circuits.

19 Claims, 11 Drawing Figures

BURGLAR ALARM BUILT IN CAR STEREO

BACKGROUND OF THE INVENTION

The present invention relates to an alarm system for an automobile that is built into the car stereo or radio/tape player that is conventionally provided in an automobile. The resulting device functions both as a car stereo and car alarm system, depending on the mode of operation desired.

In America today, the rate of a car being stolen or burglarized has miraculously jumped to an all-time high. Studies show that every thirty-seven seconds a car is illegally entered and vandalized or stolen. People of all types are effected by this disturbing rise, and they are demanding affordable security systems of high quality for use in their cars. However, to obtain an extra security system for their car is an economic problem. Also, to install an alarm system into a car requires extra space for the components of the system, which most cars lack. Therefore, an ultimate burglar-proof car alarm system would be one that could be built into the car stereo itself in order to solve both the space and cost problems normally associated with separate car alarm systems.

In accordance with the present invention, a unique product has been developed, including a custom electronic alarm circuit chip which is built into an existing car stereo system. By building the alarm circuit chip into the existing car stereo system, people who want a security system for their car can use the same system as provided for the car stereo at a very affordable price.

SUMMARY OF THE INVENTION

Accordingly, it is a primary object of the present invention to provide an alarm system for a car or automobile which may be built into a car stereo system, radio/tape player or the like.

It is a further object of the present invention to provide an alarm system for a car of a low cost which fits into the housing for a conventional car stereo or radio/tape player. It is still a further object of the present invention to provide an alarm system for a car which utilizes the push buttons, switches, speakers, power wires, ground wires, ignition wires, voltage regulators, and so forth, of the car stereo system or automobile per se, to eliminate the need for extra parts for operating the system.

These and other objects of the present invention are fulfilled by providing a car alarm system comprising a radio/tape player device within the car including speakers for generating audio sounds, an electronic control circuit, and a plurality of function selector switches; an alarm circuit for sensing alarm conditions within the car and generating alarm signals in response thereto, the alarm circuit being programmable by the function selector switches of the radio/tape player device; and a mode selection circuit for operatively interfacing the electronic control circuit and the function selector switches in a normal mode, and operatively interfacing the alarm circuit means and the function selector switches in an alarm mode, the mode selection circuit being responsive to coded signals generated by the actuation of a predetermined one of the function selector switches to change between the normal and the alarm modes.

BRIEF DESCRIPTION OF THE DRAWINGS

The objects of the present invention and the attendant advantages thereof will become more readily apparent by reference to the drawings wherein like reference numerals refer to like parts, and wherein.

DETAILED DESCRIPTION OF PREFERRED EMBODIMENTS

Figure 1:
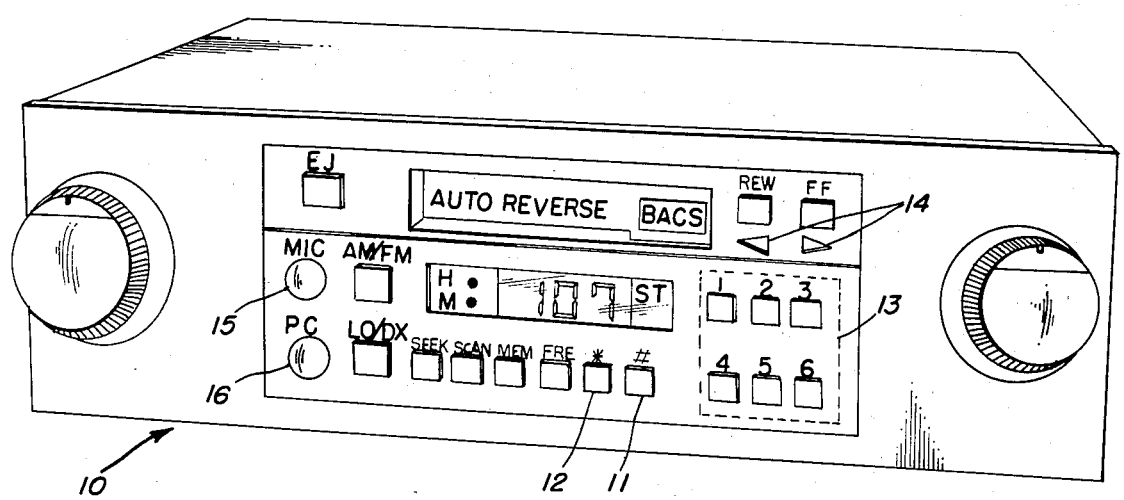
FIG. 1 is a perspective view illustrating a car stereo housing in which the alarm system of the present invention is contained.

Referring to FIG. 1, car stereo 10 is provided with six station memory buttons 13 which are single-pole, single-throw, normally-open switches, shown in key array 31. These switches also operate as alarm control switches. Car stereo 10 is further provided with normally open push button switches 11, marked #, which is emergency panic switch, and 12 marked * which controls the valet and memory circuit. Car stereo 10 includes microphone 15 to detect breaking sounds, such as when the window glass is broken. It can be also used to page outside as a normal microphone. Car stereo 10 is further provided with photocell 16 to make light-activated switch controlling headlights. The headlights are turned off when bright outside, and turned on when dark outside, automatically by the light-activated switch. Car stereo 10 is further provided with tape direction indicator lights 14. They are used also as function indicator lights of the alarm system. It should be understood that the location of the microphone, photocell, push buttons, and tape direction indicator lights may be changed and the push buttons may be separated for the car stereo and for the car alarm system.

Figure 2:
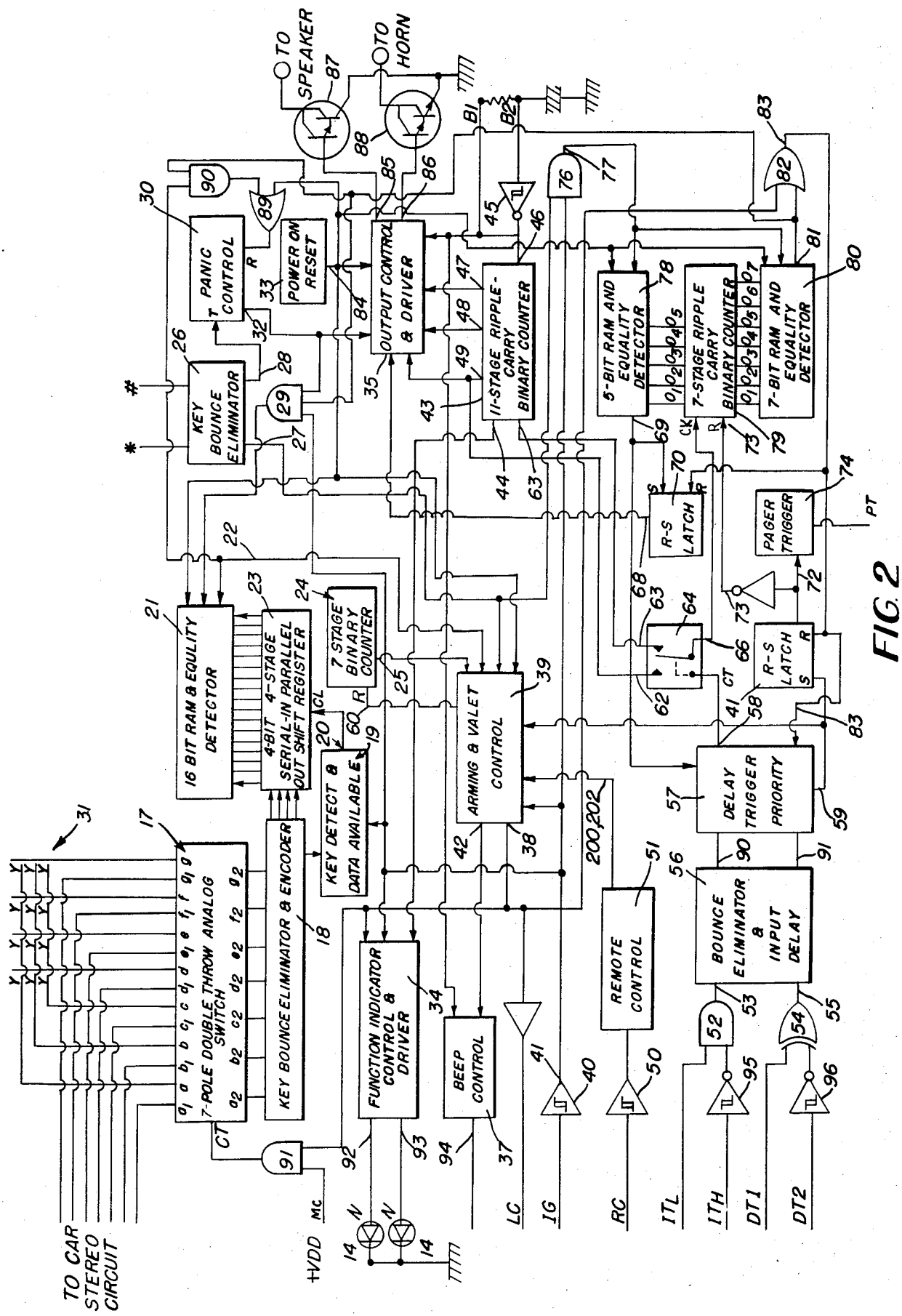
FIG. 2 is a block diagram illustrating the alarm circuit chip of the present invention which is built into the stereo housing of FIG. 1.

Referring to FIG. 2, there is illustrated a block diagram of the alarm chip of the present invention, wherein the same array of the car stereo circuit is used for the alarm circuit when mode control input MC should be connected to VDD. When the alarm is armed, the output 38 of arming and valet control 39 is low, so that the control CT of the analog switch 17 is LOW, and the IN-OUTPUTS a, b, c, d, e, f, and g are connected to $a_2$, $b_2$, $c_2$, $d_2$, $e_2$, $f_2$ and $g_2$, respectively.

Therefore, the key array 31 is connected to the key bounce eliminator and encoder 18 and operates for the alarm circuits. Once a key is depressed with the ignition ON, that is, IG and 41 are HIGH, the key bounce eliminator and encoder 18 eliminates the key bounces and encodes the signals to 4-bit data, that is 4-bit input data of 4-bit shift register 23, and the key detect and data available circuit 19 detects the key depressed and then puts the data available output 20 HIGH. The 4-bit input data of the 4-bit 4-stage serial-in parallel-out shift register 23 is shifted during the positive going transition of clock pulses on CL, that is, data available output 20. When you enter the 4-digit disarming code by pressing 4 keys sequentially, 16-bit data corresponding to the 4-digit code comes out at the output of shift register 23, and then the 16-bit RAM and equality detector 21 compares the 16-bit data output of shift register 23 with the 16-bit data prestored in its 16-bit RAM. If those two data are the same, the output 22 of the equality detector 21 goes HIGH This HIGH logic level of the output 22 sets the arming and valet control circuit 39 and forces the output 38 high. This HIGH logic level of output 38 drives lock control LC HIGH, the output of AND gate 91 HIGH and resets R-S latches 70 and 71. In this state, the alarm circuit is "disarmed". The output 72 is low, so reset R 73 of Counter 79 goes HIGH and all outputs $o_1$, $o_2$, $o_3$, $o_4$, $o_5$, $o_7$ of counter 79 go LOW. In this case, output 69 of equality detector 78 and output 81 of equality detector 80 go LOW, because the 5-bit data stored in the RAM 78 and 7-bit data stored in the RAM 80 are different from all low outputs of counter 79. Output 68 of R-S latch 70 is LOW, because R-S latch 70 is on reset state. This low output 68 controls the output control and driver 35 and forces outputs 85 and 86 of output control 35 to go LOW and turns off Darington transistor 87 and 88, driving the speaker and horn relay respectively.

The In-Out a, b, c, d, e, f, and g of analog switch 17 are now connected to $a_1$, $b_1$, $c_1$, $d_1$, $e_1$, $f_1$ and $g_1$, because output AND gate 91 is HIGH. Therefore, the key array 31 is connected to the car stereo circuits, and you can select the station by pushing a selected key of the key array 31.

Sixty-four (64) seconds afer the ignition is turned off, that is, IG and reset R 60 of the 7-stage binary counter 24 go low, output 25 of counter 24 goes HIGH and high output 25 makes the output 38 of alarm and valet control 39 go LOW. In this state, the alarm circuit is "armed". The time from the ignition turning OFF to the alarm circuit being "armed" is called "exit delay", which permits the driver enough time to get out of the car after the ignition is turned OFF without triggering the alarm. Usually the instant triggers $IT_L$ and $IT_H$ are connected to the switch of the trunk or hood light circuit of the car and delay triggers DT1 and DT2 are connected to the door switch of the dome light circuit. During the period that the door, trunk or hood is open, the alarm circuit is not armed, if they are opened within 64 seconds after the ignition is turned OFF. This exit delay extension is called "automatic exit delay adjustment". When the alarm circuit is armed, the key array 31 is connected to key bounce eliminator and encoder 18 and controls the alarm circuit, lock control LC goes LOW and both reset R inputs of latch 70 and 71 go LOW. But nothing changes on output 68 and 72 of the latches at this time. Also, nothing happens on the outputs of transistors 87 and 88. If the instant trigger input $IT_L$ goes LOW, the bounce eliminator and input delay 56 makes the input data bounce free and sends the valid low input data at 90 to delay trigger priority circuit 57 after a short time delay to get rid of noises coming from electrical discharges, such as engine spark, thunder, or static discharge. The delay trigger priority 57 holds the input data and waits for valid low input data at 91 for 1.5 seconds. If there is no valid low input data 91 during that time, the output 58 goes HIGH, control CT 58 of analog switch 64 goes HIGH also, and IN-OUT 66 is connected to IN-OUT 63. The clock frequency of IN-OUT 63 is 256 Hz which is the frequency of the second stage of 11-stage binary counter 43. The output 59 goes HIGH and sets the output 72 HIGH, then the pager trigger 74 generates a one-shot pulse at the pager trigger output PT, when the input 90 or 91 goes LOW. Also, the R input 73 of counter 79 goes LOW and the counter is advanced very quickly. When the outputs $O_1$, $O_2$, $O_3$, $O_4$ and $O_5$ of counter 79 become the same as the store data at 5-bit RAM 78, the output 69 of the quality detector 78 goes HIGH and resets the output 58, so that CT of analog switch 64 goes to a LOW state, and sets the output 68 of latch 70 to a HIGH state. Then the output 68 drives output control and driver 35 to generate High-Low siren pulses at output 85 and intermittent horn pulses at output 86. Therefore, the transistors 87 and 88 activate the speaker and horn relay, respectively. The counter is advanced one count each second, because output 58 is LOW and In-Out 66 is connected to In-Out 62, whose clock frequency is 1 Hz, which is the frequency of the 10th stage of counter 43. The counter 79 is advanced further and if the outputs $O_1$ to $O_7$ of counter 79 become the same as the stored data at 7-bit RAM 80, the output 81 of the equality detector goes HIGH. Then high-output 81 resets output 72 of latch 71, and the output 68 of latch 70 to a LOW state. Then all of the outputs $O^1$ to $O^7$ of counter 79 go LOW, because reset R input 73 of counter 79 goes HIGH, and the output control and driver 35 stops activating the speaker and horn. If DT1 goes HIGH with DT2 LOW, or vice versa, output 55 of X-OR gate 54 goes LOW, so output 91 goes LOW. Then the output 58 stays at a LOW state and the counter is advanced every second. So, the output control and driver 35 does not activate the speaker and horn until the output 69 of equality detector 78 goes HIGH, that is, until the outputs $O^1$ to $O^5$ of counter 79 become the same as the stored data in 5-bit RAM 78. This time interval from negative transition of output 55 to activating the speaker and horn is called "entry delay".

The panic control 30 is a toggled flip-flop with a reset. If the switch marked # is pressed once, the output 32 of the panic control 30 goes HIGH and the output control and driver 35 activates the speaker and horn, and if it is pressed once again, output 32 goes LOW and stops activating the speaker and horn.

To program a 4-digit disarming code, one first triggers the circuit and turns on the ignition, where the triggering means connecting IT2 to ground or $IT_H$ to VDD or brings DT1 to a LOW state with DT2 HIGH or vice versa. In other words, it brings the output 53 or 55 to a low state. Next, one presses the panic switch marked # once to make the output 32 HIGH. Then one enters the new disarming code, then the encoded 4-bit, 4-digit disarming code comes out at the 16 outputs of shift register 23, and waits until output 81 of equality detector 80 goes HIGH, so the speaker and horn stops sounding. At the moment the output 81 goes HIGH, the output of the three input AND gates 29 go HIGH, so the 16-bit disarming code data at the outputs of shift register 23 are stored in the 16-bit RAM 21. After this, the output 22 of equality detector 21 goes HIGH and the alarm is disarmed only when the entered 4-digit code is the same as the code stored in the 16-bit RAM 21.

To program "Entry Delay", one first triggers the alarm circuit, then the counter 79 is advanced and 5-bit data corresponding to the advanced time comes out at the outputs $O^1$ to $O^5$ of counter 79. Then one turns ON the ignition and presses the switch marked * at the desired time between 1 second and 32 seconds after triggering. Then the output 77 of AND gate 76 goes HIGH, and the 5-bit data corresponding to the advanced time at the outputs $O^1$ to $O^5$ of counter 79 are stored in the 5-bit RAM 78.

To program alarm duration, for the alarm duration time interval of the alarm sounds, one first triggers the alarm circuit. Then the counter 79 is advanced, the alarm starts to sound when the counter advanced time passes "entry delay", and 7-bit data corresponding to advanced time comes out at the outputs $O^1$ to $O^7$ of counter 79. One then turns on the ignition and presses the switch marked * at the desired time between 33 seconds and 128 seconds, after triggering. Then the output 77 of AND gate 76 goes HIGH, and the 7-bit data corresponding to the advanced time at the outputs $O^1$ to $O^7$ of counter 79 are stored in the 7-bit RAM 80. The function indicator and driver 34 is controlled by 3 inputs, ignition 41, arming and valet control output 38, and the 8th stage (output 44) of counter 43, whose frequency is 4. The two LEDs connected to output 92 and 93 blink anytime one after the other if the ignition turns OFF, that is, if 41 goes LOW. Both LEDs are turned OFF, if the ignition turns on and the circuit is disarmed, that is, IG 41 and output 38 go HIGH. Both LEDs are turned ON, if the ignition turns on and the alarm circuit is armed, that is, IG 41 goes HIGH and output 38 goes LOW.

To set the valet mode, one first disarms the alarm circuit and pushes the switch marked * with the ignition ON. Then the alarm is not armed until pushing of the switch marked * with the ignition OFF.

The beep control circuit notifies the state of the alarm circuit by beeping. The output 94 of beep control circuit 37 is usually connected to the siren pulse output 85 to activate the speaker. If the speaker beeps once when the ignition is OFF, the alarm will be armed after 64 seconds. If the speaker does not beep when the ignition is OFF, the alarm is in the valet mode. To clear the valet mode, one pushes the switch marked * with the ignition OFF. Then the speaker beeps once to notify that the valet mode is cleared. A single-pulse input at the remote control input RC disarms the alarm and the speaker beeps once. Two pulses in 1.5 seconds at the input RC drive the alarm to the valet mode, and the speaker does not beep.

Figure 3:
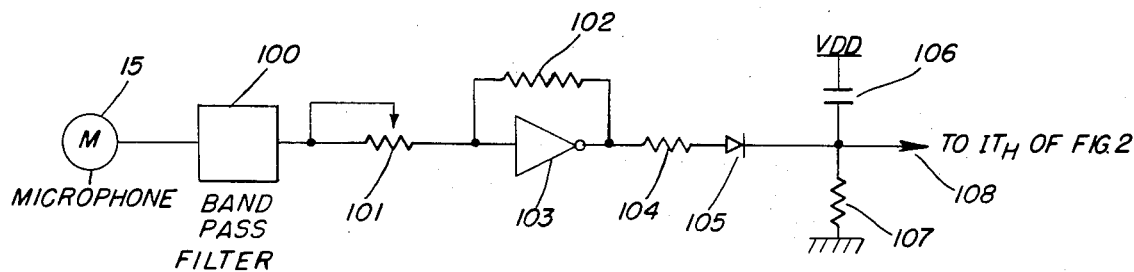
FIG. 3 is a circuit schematic illustrating a sound detecting sensor suitable for use with the alarm chip of FIG. 2.

The circuit of a sound-detecting sensor for use with the alarm circuit of FIG. 2 is shown in FIG. 3. The sound signal detected by microphone 15 is filtered by band pass filter 100 which passes only the glass-breaking sound signal to reduce the possibilities of false alarming, and is amplified by inverter 103, resistor 101 and 102. This amplified signal charges capacitor 106 through resistor 104 and diode 105, to give a time delay. Therefore, only relatively long sound signals can charge the capacitor 106. This also eliminates false alarming coming from short sound pulses such as the sound generated when thermal expansion or contraction of a car engine or car body occurs. The point 108 is connected to the input $IT_H$ of Schmitt trigger 95 in FIG. 2. When the voltage at the point 108 becomes greater than the positive-going threshold voltage $V_{T+}$ of the Schmitt trigger 95, the alarm circuit in FIG. 2 is triggered. If there is no signal, the capacitor 106 is discharged through resistor 107.

Figure 4:
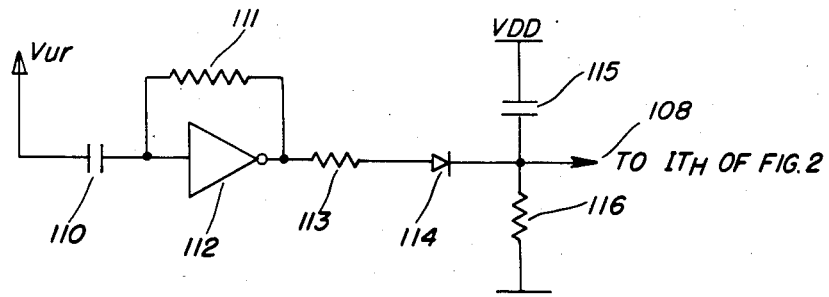
FIG. 4 is an electrical schematic of a voltage drop sensor suitable for use with the alarm chip of FIG. 2.

The circuit of a voltage drop sensor for use with the alarm circuit of FIG. 2 is shown in FIG. 4. The capacitor 110 is connected to an unregulated battery (+) power source. If the voltage drop occurs in the car's battery, the signal is amplified by inverter 112 and resistor 111. The functions of 113, 114, 115 and 116 are the same as the functions of 104, 105, 106, and 107 in FIG. 3

Figure 5:
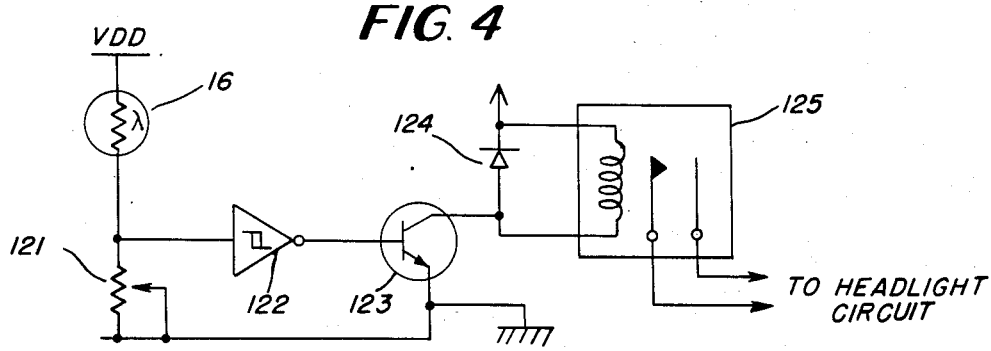
FIg. 5 is a light-activated switch circuit schematic suitable for use with the alarm chip circuitry illustrated in FIG. 2.

The light-activated switch for use with the alarm circuit of FIG. 2 is illustrated in FIG. 5. The photocell 16 is several K-Ohms when brightly illuminated, and a couple M-Ohms when dark. When dark, the resistance of photocell 16 is HIGH, so the input voltage of Schmitt trigger 122 goes LOW and turns ON the transistor 123. Then the relay activates the headlight circuit of the car when, and only when, the ignition is ON. When bright, the transistor 123 is turned OFF, because the resistance of photocell 16 is LOW and the output of the Schmitt trigger 122 goes LOW.

The lock control LC may control a relay connected to the engine starter or ignition circuit of the car to make the starter kill, or the ignition kill, the system, which prevents the engine from starting or running when the alarm is armed.

Figure 6:
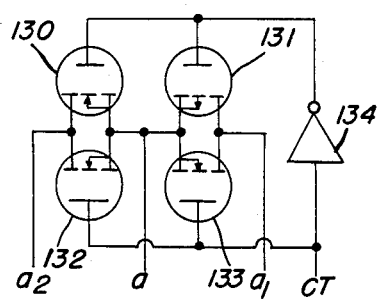
FIG. 6 is a circuit schematic illustrating the 7-pole, double-throw analog switch 17 of the alarm chip circuit of FIG. 2.

An example of the 7-pole, double-throw analog switch 17 of FIG. 2 is shown in FIG. 6. When CT is HIGH, because the gate of n-channel transistor 133 is HIGH and the gate of p-channel transistor 131 is LOW, transistor 131 and 133 are turned ON. Therefore, a is connected to $a_1$, but because n-channel transistor 130 and p-channel transistor 132 are turned OFF, $a_2$ is disconnected from a. When CT is low, a is connected to $a2$.

Figure 7:
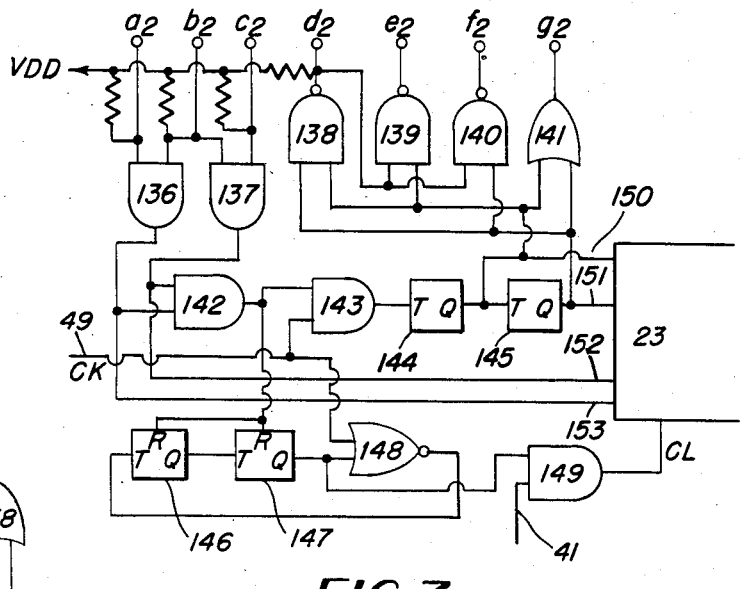
FIG. 7 is a circuit schematic illustrating the key bounce eliminator and encoder 18 of the circuit of FIG. 2.

Examples of key bounce eliminator and encoder 18 and keydetect and data-available circuit 19 are shown in FIG. 7. These circuits also are incorporated into the circuit of FIG. 2. The gates 138, 139, 140 and 141 have open drain n-channel outputs, so those outputs are active when LOW. When no keys are depressed, $a_2$, $b_2$, and $c_2$ are pulled high by internal pull-up resistors, so the output of 142 goes HIGH. The output of toggle flip-flops 146, 147 go LOW, because the reset inputs of these flip-flops are HIGH, then the output CL of 149 goes LOW and stays low, and no data at 150, 151, 152 and 153 is shifted into the shift register 23 because of clock CL of shift register 23 is LOW. The outputs d2, e2, f2, and g2 go LOW sequentially as the 2-bit binary counter including toggle flip-flops 144 and 145 advances. When a key is depressed, so c2 is connected to e2, for example, nothing will happen during the output of e2 if 139 is OFF, since c2 remains high. When the e2 goes LOW, c2 will go LOW. This disables the counter made of toggled flip-flops 144 and 145, and keeps e2 LOW, because the outputs of 137, 142 and 143 so the input T of the counter go LOW and stay LOW. At that time, the data at 150, 151, 152 and 153 are logic "1", logic "0", logic "0" and logic "1", respectively. These encoded data are shifted into the shift register 23 when the ignition is ON, so that when 41 goes HIGH and the output of 147 goes HIGH, the output CL of 149 goes HIGH.

When 142 detects key closure, so the output of it goes LOW, the 2-bit binary counter made of 146 and 147 advances because its reset input goes LOW. After the counter counts two clock pulses, the output of 147 goes HIGH and the output of 147 disables the counter. Therefore, output CL of 149 stays HIGH. During the key closure, the key may bounce several times, but this bounce period is much shorter than the clock period of CK 49 and the high output of 142 during the bounce period resets the output of 147 to LOW, and the counter starts to count the clock pulses at CK 49 after key bounces stop. Therefore, the key bounces are eliminated, and only the valid encoded data at 150, 151, 152 and 153 are shifted to shift register 23. When the key is released, c2 so the output of 142 goes HIGH immediately, then the output of 147 and output CL of 149 go LOW.

Figure 8:
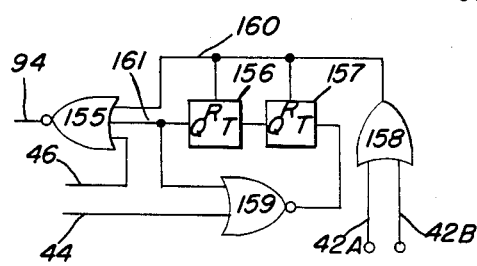
FIG. 8 is a circuit schematic illustrating the beep control circuit 37 of FIG. 2.

An example of the beep control, 37 of the alarm circuit of FIG. 2, is shown in FIG. 8. When the alarm is in the valet mode, the input 42B of 158 stays HIGH. In this case, the output 161 of 156 and the output 94 of 155 go LOW, because the output 160 of 158 is HIGH, even though the input 42A goes LOW. If 42A stays LOW and 42B goes to LOW, the output 160 of 158 goes LOW immediately and the output 161 of 156 stays LOW, then goes HIGH after counting two clock pulses of clock 44. During both outputs 160 and 161 are LOW, the output 94 of 155 oscillates at a frequency which is the same as clock 46. Therefore, beep control 37 gives short beeping sounds when the valet mode is cleared. Also, when the ignition is OFF, with the valet mode cleared, it gives short beeping sounds because 42B stays LOW and 42A goes LOW.

Figure 9:
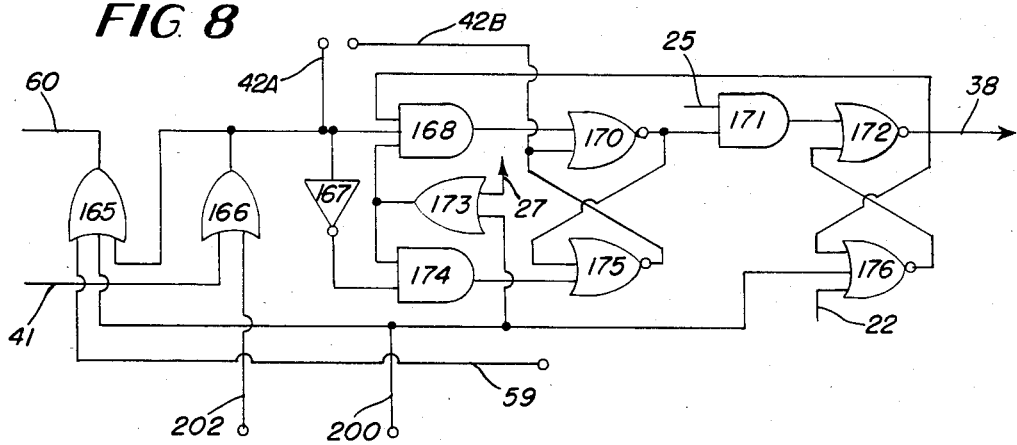
FIG. 9 is a circuit schematic illustrating the arming and valet control circuit 39 of the circuit of FIG. 2.

The arming and valet control circuit of FIG. 2 is shown in FIG. 9. When the valet mode is cleared and if one enters the correct disarming code, the input 22 of 176 goes HIGH, the output 38 goes HIGH and is latched HIGH. This state is called "disarmed". If one turns OFF the ignition 41, the output 60 of 165 goes LOW and the 7-stage binary counter 24 starts to advance, then 64 seconds later the input 25 of 171 goes HIGH and latches output 38 of 172 to LOW. This state is called "armed". To enter the valet mode state, one turns on the ignition, disarms the system and pushes the * 12. Then all inputs of 168 go HIGH and latch the output of 170 to LOW. After that, the input 25 of 171 has no effect on the system.

Figure 10:
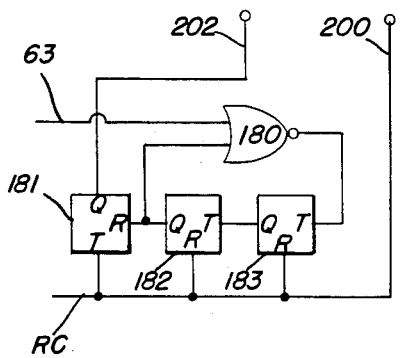
FIG. 10 is a circuit schematic of the remote control device 51 of the circuit of FIG. 2.

To clear the valet mode, one turns OFF the ignition and pushes the * 12, then all inputs of 174 go HIGH and latch the output of 170 to HIGH. The remote control circuit 51 is shown in FIG. 10. One positive pulse to RC makes the output of 176 LOW and the output on line 200 of 173 HIGH. Therefore, it disarms the system and clears the valet mode if it was in the valet mode. At the negative transition of the pulse, output Q of 181 on line 202 goes HIGH and stays HIGH during the output Q of 182 is LOW, which goes HIGH 1.5 seconds later after the negative transition of the pulse. 1.5 seconds is the time the binary counter, including 182 and 183, counts two clock pulses of clock 63. One more pulse within 1.5 seconds puts the system on valet because all inputs of 168 are HIGH.

Figure 11:
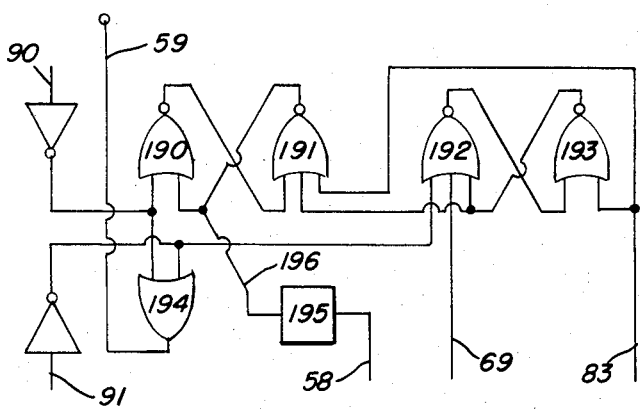
FIG. 11 is a circuit schematic of the delay trigger priority device 57 of the circuit of FIG. 2.

The delay trigger priority circuit 57 of FIG. 2 is shown in FIG. 11. When instant trigger line 90 goes LOW, the output 196 of 191 goes HIGH and is latched HIGH. The delay circuit 195 which is almost the same as the circuit made of 180, 182 and 183 in remote control 51, holds this high data at 196 for 1.5 seconds. If the delay trigger line 91 does not go LOW within 1.5 seconds, the output 58 of delay circuit 195 goes HIGH, but if 91 goes LOW within 1.5 seconds, the output 58 stays LOW.

It should be understood that the system described hereinbefore may be modified as would occur to one of ordinary skill in the art without departing from the spirit and scope of the present invention.

What is claimed is:

1. A car alarm system comprising:
   (a) a radio/tape player device within the car including speakers for generating audio sounds, an electronic control circuit and a plurality of function selector switches;
   (b) alarm circuit means for sensing alarm conditions within said car and generating alarm signals in response thereto, said alarm circuit means being programmable by said function selector switches;
   (c) mode selection circuit means for operatively interfacing said electronic control circuit and said function selector switches in a normal mode, and operatively interfacing said alarm circuit means and said function selector switches in an alarm mode, said mode selection circuit means being responsive to coded signals generated by the actuation of predetermined ones of said function selector switches to change between the normal and alarm modes; and
   (d) disarming means for said alarm circuit means including,
      1. input circuit means for inputting multi-bit disarming codes generated by sequential actuation of a plurality of said function selector switches,
      2. memory means for storing multi-bit codes input by said plurality of said function selector switches during a programming mode of said disarming means; and
      3. equality detector means for determining when a multi-bit code input by the sequential action of said plurality of function selector switches equals the multi-bit code stored in said memory means, and when equal, generating a disarm signal to said alarm circuit means to change said system to said normal mode.

2. The alarm system of claim 1, further comprising: function indicator lights in said radio/tape player for indicating radio/tape player functions in said normal mode and alarm control functions in said alarm mode.

3. The alarm system of claim 1 further comprising: door light circuit means for each of the doors of the car which energize interior lights in the car when a door is opened; and
door alarm sensor means for sensing when said interior lights are energized and generating an alarm signal in response thereto when in said alarm mode.

4. The alarm system of claim 3, further comprising: an ignition circuit for said car including an ignition switch having ON and OFF positions; and
exit delay means operatively coupled to said door alarm sensor means for disabling the same for a selected exit delay period in response to turning said ignition switch from ON to OFF and the actuation of at least a predetermined one of said function selector switches.

5. The alarm system of claim 4, wherein said exit delay period is programmable into said alarm circuit means by said selector switches in a program mode.

6. The alarm system of claim 3, further comprising:
hood light circuit means in said car which energizes a hood light under the car hood when the hood is opened; and
hood alarm sensor means for sensing when the hood light is energized and generating a hood alarm signal in response thereto.

7. The alarm system of claim 4, further comprising:
hood light circuit means in said car which energizes a hood light under the car hood when the hood is opened; and
hood alarm sensor means for sensing when the hood light is energized and generating a hood alarm signal in response thereto.

8. The alarm system of claim 7, further comprising:
exit delay modifying means for restarting said exit delay period if said hood is opened during said exit delay period.

9. The alarm system of claim 3, further comprising:
trunk light circuit means in said car which energizes a trunk light under the car trunk when the trunk is opened; and
trunk alarm sensor means for sensing when the trunk light is energized and generating a trunk alarm signal in response thereto.

10. The alarm system of claim 4, further comprising:
exit delay modifying means for restarting said exit delay period if said trunk is opened during said exit delay period.

11. The alarm system of claim 3, further comprising:
an ignition circuit for said car including an ignition switch having ON and OFF positions; and
entry delay means operatively coupled to said door alarm sensor means for disabling the same for a selected entry delay period in response to turning said ignition switch from ON to OFF and the actuation of at least a predetermined one of said function selector switches.

12. The alarm system of claim 11, wherein said entry delay period is programmable into said alarm circuit means by said selector switches in a program mode.

13. The alarm system of claim 1, wherein said alarm circuit means includes a panic circuit means for generating an alarm signal in response to the actuation of a selected one or more function selector switches.

14. The alarm system of claim 1, further comprising:
audible signal means for generating a beep signal through said speaker to announce the said alarm states.

15. The alarm system of claim 1, further comprising:
valet control means for disabling all alarm functions in response to the actuation of a selected one of said function selector switches.

16. The alarm system of claim 1, further comprising:
microphone means for sensing the breaking of glass of the car windows and generating an alarm signal.

17. The alarm system of claim 1, further comprising:
photocell means for turning the car headlights on when the ambient light level falls below a predetermined level.

18. The alarm system of claim 1, further comprising:
battery voltage detector means for sensing the voltage of the car battery and generating an alarm signal when the voltage falls below a predetermined level.

19. The alarm system of claim 1, further comprising:
lock-out means coupled to said ignition circuit for precluding the engine from starting when the system is in an alarm mode.

* * * * *